(12) United States Patent
Cohen

(10) Patent No.: US 7,551,441 B2
(45) Date of Patent: Jun. 23, 2009

(54) HEAT DISSIPATION ASSEMBLY FOR COMPUTING DEVICES

(75) Inventor: Alan Mark Cohen, Santa Rosa, CA (US)

(73) Assignee: H Christian Gunderson, Petalwma, CA (US)

( * ) Notice: Subject to any disclaimer, the term of this patent is extended or adjusted under 35 U.S.C. 154(b) by 21 days.

(21) Appl. No.: 11/947,182

(22) Filed: Nov. 29, 2007

(65) Prior Publication Data

US 2008/0106863 A1    May 8, 2008

Related U.S. Application Data

(62) Division of application No. 11/031,930, filed on Jan. 10, 2005, now Pat. No. 7,292,437.

(51) Int. Cl.
*H05K 7/20* (2006.01)
(52) U.S. Cl. ............ 361/699; 165/80.4; 257/714; 439/485

(58) Field of Classification Search ............ None
See application file for complete search history.

(56) References Cited

U.S. PATENT DOCUMENTS

| 4,341,432 | A | * | 7/1982 | Cutchaw | 439/485 |
|---|---|---|---|---|---|
| 5,574,627 | A | * | 11/1996 | Porter | 361/719 |
| 6,054,676 | A | * | 4/2000 | Wall et al. | 219/209 |
| 6,166,607 | A | * | 12/2000 | Schoellkopf | 331/57 |
| 6,840,794 | B2 | * | 1/2005 | Chiu | 439/485 |
| 7,042,723 | B2 | * | 5/2006 | Espersen et al. | 361/699 |

\* cited by examiner

*Primary Examiner*—Gregory D Thompson

(57) ABSTRACT

An improvement for an assembly for use in a computing device which includes a microprocessor and a motherboard and a socket for receiving and making electric contact with the microprocessor. A heat sink is included which is in thermal contact with the microprocessor whereby a water barrier is applied to and proximate the socket for preventing water of condensation from contacting areas covered by the water barrier and a moisture absorbent surrounding the heat sink.

14 Claims, 2 Drawing Sheets

HEAT DISSIPATION ASSEMBLY FOR COMPUTING DEVICES

PRIOR APPLICATIONS

This is a divisional of application Ser. No. 11/031,930 filed on Jan. 10, 2005.

TECHNICAL FIELD OF INVENTION

Computing devices, including laptop computers, desk top computers, servers and video game terminals employ microprocessors which generate considerable heat. In fact, the heat generated from microprocessors is generally considered the limiting factor in computing speed. A heat sink is provided in thermal contact with a microprocessor in cooperation with a water barrier applied to and proximate a socket configured within the computing device's motherboard for preventing water of condensation from contacting areas covered by the water barrier. Efficient refrigeration protocols are suggested to maximize heat dissipation.

BACKGROUND OF THE INVENTION

As computing devices have become more powerful, microprocessor integrated circuits have become more sophisticated having increased clock speeds and computing power. As speeds increase, microprocessors operate at higher temperatures and, in fact, the single most important limiting factor in inhibiting computing speed is the thermal energy generated from such devices.

Recognizing that heat generated from microprocessors limits the speed and resulting power of the computing device, efforts have been made to dissipate thermal energy. Most personal computers employ cooling fans integrated within the computer's chassis. However, cooling fans tend to be noisy and thus can represent a significant distraction to a user. Further, the mere passage of air over a microprocessor contained within the small confines of a personal computer is not a particularly efficient method of dispersing heat energy. Unless sufficient cooling is carried out, the heat generated by the microprocessor can cause it to overheat and damage the device.

Recognizing that conventional fan-cooled computers represent a distraction and can cause a significant annoyance to a user affecting productivity, there have been attempts to deal with heat dissipation by means other than a fan. For example, in published application 2004/0156180, a large heat sink is employed as part of the computer chassis that contains the motherboard and hard drive. The heat sink is exposed to the external ambient air for heat dissipation while the motherboard and hard drive of the device are positioned within the chassis such that they are held tightly against the heat sink to allow the heat generated by the microprocessor and hard drive to be conducted to and dissipated by the heat sink. A further example can be found in U.S. Pat. No. 6,367,543 disclosing a housing which includes a lid having liquid flowing through ports located therein. A plurality of pins project outwardly from the bottom wall of the chamber, housing the active components of the device, in a staggered pattern whereby a thermal jacket is positioned over a liquid-held heat sink that does not directly engage the semiconductor package. The rather inefficient configuration taught by this reference is intended to reduce condensation that may form when operating at sub-ambient temperatures to reduce the risk of water damage to the interior of the cooled chamber. It is further taught that the outer surface of the thermal jacket is exposed to a sealant engaging the semiconductor element that remains at or near ambient temperature to minimize condensation on the surface of the thermal jacket.

U.S. Pat. No. 6,725,682 shows a desk top type personal computer employing a cooling apparatus composed of three modules, namely, a heat exchanger, a chiller and a pump. The heat exchanger is mounted so as to be thermally coupled to a CPU microprocessor. In operation, fluid is pumped from a pump module through a chiller module and through a heat exchanger and is finally recirculated to the pump. When the cooling apparatus is operating, chilled fluid passes through the heat exchanger so as to extract heat produced by the microprocessor. It is taught that the body of the electronic device has protrusions that may be thermally coupled to the hot portion of the device to maintain it at a sufficient distance from the surface of the microprocessor so that sufficient ambient air may circulate therebetween so as to substantially prevent condensation from forming on the surface of the electronic device and from forming on and dripping from the heat exchanger when fluid is cooled to at least the dew point of the ambient air. Clearly, such a configuration reduces the effectiveness of the heat sink for direct contact between it and the electronic device to be cooled is avoided so as to prevent water of condensation from being created at or around the microprocessor.

In light of the above discussion, it appears that several matters are well recognized in the prior art. Firstly, it is universally accepted that microprocessors, hard disk drives and other active components in a computing device must be cooled for limitations as to speed and computing power are limited by failure to dissipate heat, particularly from a microprocessor. Secondly, the prior art, although suggesting alternatives to traditional fan-based cooling devices, has suggested either non-optimal heat transfer configurations or limitations in cooling in order to minimize or entirely prevent water of condensation from adversely impacting the microprocessor and its surrounding topology.

It is thus an object of the present invention to provide an efficient heat transfer assembly which eliminates the need for noise generating components such as air moving fans.

It is a further object of the present invention to provide an effective heat transfer assembly which is not limited to a specific geometry or cooling temperature and which can be employed without damaging the microprocessor, its surrounding socket assembly and other components of the supporting motherboard.

These and further objects will be more readily apparent when considering the following disclosure and appended claims.

SUMMARY OF THE INVENTION

The present invention involves an assembly for use in a computing device such as a personal laptop computer, desk top computer, server or video game terminal. Each of these devices includes a microprocessor which generates heat during its operation. The invention includes the use of a heat sink in thermal contact with the microprocessor which is capable of providing a heat dissipating sink for removing thermal energy from the microprocessor much more effectively than devices of the prior art. The present invention includes applying a water barrier proximate the socket employed for making electrical connection to the microprocessor preventing water of condensation from contacting areas covered by the water barrier. Alternatively, the microprocessor can be encased within a shell having a fluid inlet and fluid outlet for recirculating coolant proximate the microprocessor and, if properly configured, the need for a water barrier applied to the socket and surrounding regions can be effectively eliminated. In either case, efficient refrigeration protocols are suggested to maximize heat dissipation.

DETAILED DESCRIPTION OF THE INVENTION

Figure 1:
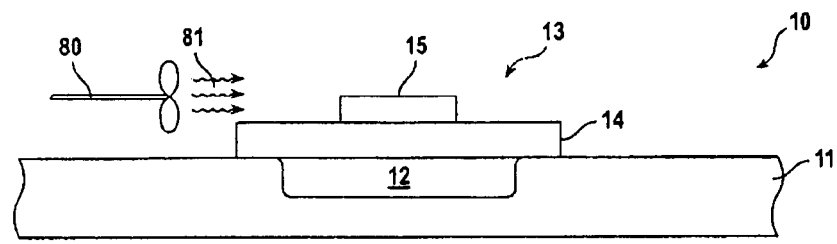
FIG. 1 is a cross-sectional plan view of the prior art showing a microprocessor installed on a motherboard being cooled by fan generating circulating air.
Figure 3:
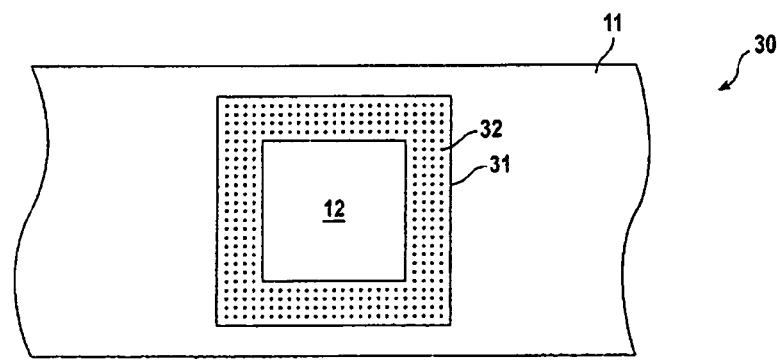
FIG. 3 is a top plan view of a socket and supporting motherboard for accepting a microprocessor for use in practicing the present invention.

Turning first to the prior art as depicted in FIG. 1, a cross-sectional view of a relevant area of a computing device 10 is shown. Specifically, motherboard 11 is depicted in partial cross-section supporting a microprocessor CPU 13 consisting of substrate 14 and die 15. Microprocessor CPU 13 can be applied to supporting motherboard 11 either through a pin connection or by a flush connection over indented region 12. That portion of motherboard 11 supporting microprocessor CPU 13 is shown in top plan view in FIG. 3. In this embodiment, pin receiving socket 31 having openings 32 for receiving the pins of substrate 14 (not shown) surrounds indented region 12.

Turning back to FIG. 1, a schematic depiction of a current cooling method commonly employed in laptop and desk top computers is shown. Specifically, fan 80 is caused to rotate by connecting a shaft to a motor (not shown) which can either be constantly engaged or periodically engaged through activation prompted by a thermo-couple or other thermal sensor located in the region of microprocessor CPU 13. As the temperature of this device reaches a threshold value, fan 80 is engaged causing air flow schematically shown by arrows 81. However, as noted previously, the activation of fan 80 is not only noisy and distracting to a user of the computing device but the mere passage of air in the directions of arrows 81 does not represent a particularly efficient means of cooling microprocessor CPU 13.

Figure 2:
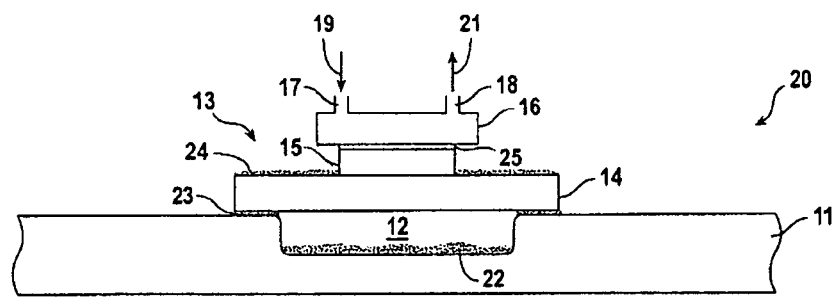
FIGS. 2, 4 and 5 are cross-sectional plan views of various embodiments of the present invention.

A first embodiment of the present invention can be readily visualized by reference to FIG. 2. As in the configuration depicted in FIG. 1, computing device 20 again consists of motherboard 11 supporting microprocessor CPU 13 which, in turn, consists of support 14 and die 15. However, instead of employing fan 80, a heat sink consisting of heat sink shell 16 having fluid inlet port 17 and fluid exit port 18 to facilitate the passage of a coolant such as water, alcohol, antifreeze or mixtures thereof to the interior of heat sink shell 16 is used. Heat sink shell 16 is in direct thermal contact with die 15, directly, or through the use of a heat conductive film 25 of, for example, a silver based thermal grease.

As noted previously, the prior art strongly suggests either refraining from adopting a configuration such as shown in FIG. 2 or, if such a configuration is adopted, to limit the temperature of coolant passing within heat sink shell 16 so that the exterior surface of the heat sink shell does not drop below the surrounding dew point of the air within the computing device in order to avoid water of condensation from adversely affecting socket 31 and, perhaps, other active components on motherboard 11.

In practicing the present invention, the limitations suggested by the prior art limiting the temperature of heat sink shell 16 can be ignored. Specifically, applicant proposes, as a first embodiment, applying a water barrier proximate socket 31 in the areas where water of condensation is likely to appear and where such water of condensation, if not dealt with effectively, would compromise the computing device.

It is suggested that several water barrier implementations can be employed in carrying out the present invention. For example, the water barrier can comprise a layer of dielectric grease which can be spread over the socket in areas 23 and within indented region 12 as shown as area 22 and over substrate 14 shown as area 24. A suitable dielectric grease for use in carrying out the present invention is Luberex Dielectric Grease. Alternatively, a low viscosity liquid can be sprayed onto the socket and surrounding regions such as a silicone spray sold by Amsoil. As yet a further alternative, the entire motherboard 11 can be dipped within a fluid which can either remain in its fluid state or dried so long as its dielectric water barrier properties are maintained and electrical connections are not filled or otherwise blocked through the dipping process. Suitable fluids for dipping include latex and oil base paints which can also be brushed or sprayed in the socket region of computing device 20. Further, commonly available household consumer products such as fingernail polish could be applied to socket region 31 and portions of substrate 14 as shown in FIG. 2 in order to create the desired water barrier. In doing so, a user of the present invention need not be concerned with relative humidity or dew point temperature of the air within computing device 20 or the relative temperature of heat sink shell 16 in terms of water of condensation. Instead, heat shell 16 can be reduced to any desired temperature and thus provide an extremely effective expedient for drawing thermal energy from die 15 thus removing heat as a barrier to increased clock speeds and computing power.

Figure 4:
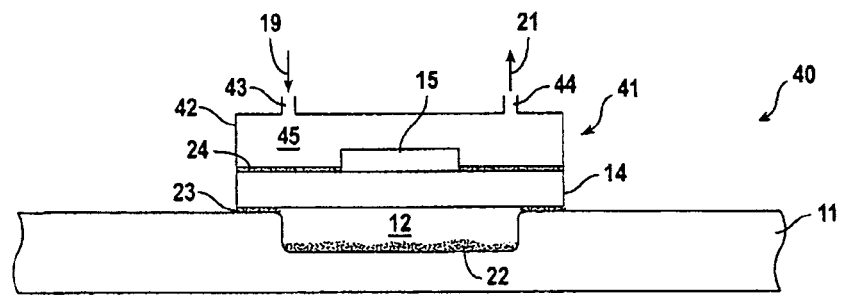

FIG. 4 represents yet another embodiment of the present invention. Specifically, computing device 40 again consists of motherboard 11 supporting microprocessor CPU 41 having substrate 14 and die 15 as shown. However, microprocessor CPU 41 can be encased within shell 42 either directly at the manufacturing facility where microprocessor CPU 41 is manufactured or as an aftermarket add on component. In this instance, inlet port 43 and outlet port 44 can again be employed to receive and circulate cooling fluid in the direction of arrows 19 and 21. In employing this embodiment, thermal grease is no longer required as there is direct physical contact between the cooling fluid within space 45 and the heat generating die 15. In practicing the embodiment shown in FIG. 4, a water barrier in terms of a dielectric grease or other expedient can be applied in the region proximate socket 31 including indented region 12 in the form of barrier 22, substrate surface in the form of barrier 24 and the contact region between the substrate 14 and socket 31 in the form of barrier 23.

Figure 5:
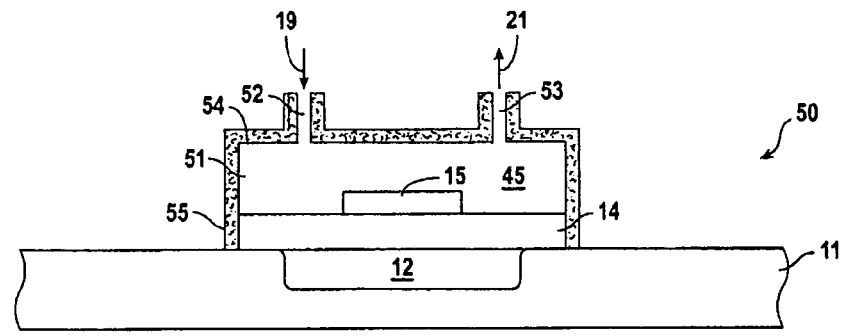

FIG. 5 depicts yet a further embodiment of the present invention. In this instance, computing device 50 again includes the depiction, in partial cross-section, of motherboard 11 focusing upon its socket region 31. Microprocessor CPU 51 again is shown as consisting of substrate 14 which can include pin connections to pin openings 32 or could represent a flush mounted connection to socket region 31 which further supports die 15. As in FIG. 4, a shell 54 is placed about microprocessor CPU 51 for receiving coolant through opening 52 and circulating coolant in area 45 to be expelled through opening 53 in the direction of arrows 19 and 21. Thus, coolant fills region 45 thus acting as an effective heat sink for heat generating die 15.

The FIG. 5 embodiment further includes outer shell 55 creating a space between it and shell 54. In order to minimize the flow of water of condensation, an absorbent 53, such as a cotton cloth, can be applied in this region thus absorbing water of condensation formed at the surface of shell 54 and thus preventing moisture from compromising socket 31 and its surrounding area. Although not shown, the embodiment of FIG. 5 can also employ, as an additional expedient, the various water barriers discussed previously and applied to the socket and its proximity again, as shown and described with relation to FIGS. 2 and 4.

As noted previously, the present invention can effectively reduce the temperature of a microprocessor CPU without the need to use conventional noise generating devices such as cooling fans. Further, because the heat sink and microprocessor can be positioned to abut one another, heat transfer from the die of the microprocessor CPU through the heat sink can be much more effective than competing devices taught in the prior art. Thus, the limitations placed upon computing devices through over heating of the microprocessor CPU can effectively be eliminated.

Figure 6:
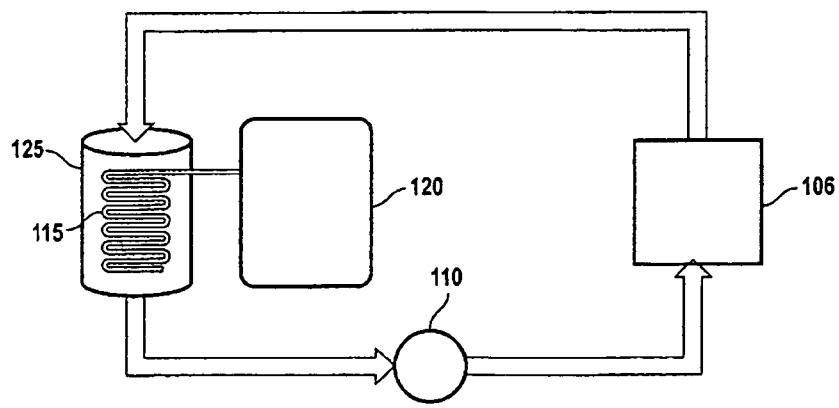
FIG. 6 is a schematic diagram of an efficient heat transfer protocol for use in practicing the present invention.

Although there are a number of protocols useful in providing coolant to the recited heat sink, a preferred arrangement is shown schematically in FIG. 6. Specifically a continuous fluid path is shown feeding a coolant to a heat sink strategically located proximate CPU 100. This fluid is maintained at the desired (low) temperature within reservoir 125 and circulated by means of pump 110. Fluid within reservoir 125 is maintained at a predetermined temperature through the use of refrigeration unit 120 that circulates a refrigerant such as Freon through evaporator 115 consisting of heat transfer coils and an expansion valve (not shown).

The present invention has been described fundamentally in terms of a computing device suggesting its application principally in the areas of laptop and desk top personal computers. However, applicant's invention can be used in such diverse areas as servers and video game terminals. Often times, servers are placed in a stacked relationship and positioned in a facility requiring aggressive air conditioning to reduce the ambient temperature of the facility well below that which would otherwise be necessary for human comfort. In other words, the active components within the server generating heat are dealt with by reducing the entire ambient surrounding temperature of the servers which represents an exceedingly inefficient use of energy. By employing the present invention, however, a server facility need not be air conditioned and suitable heat sinks such as those described above, can be employed only in those areas within each server requiring the dissipation of thermal energy.

In view of the various embodiments to which the present invention may be applied, it is noted that the embodiments described herein are meant to be illustrative only and should not be taken as limiting the scope of the invention.

The invention claimed is:

1. In an assembly for use in a device comprising a microprocessor and a motherboard that includes a socket for receiving and making electric contact with said microprocessor and a heat sink in thermal contact with said microprocessor, the improvement comprising a water barrier applied to and proximate said socket for preventing water of condensation from contacting areas covered by said water barrier and inner and outer shells and a moisture absorbent therebetween surrounding said heat sink.

2. The assembly of claim 1 wherein said water barrier comprises a layer of dielectric grease.

3. The assembly of claim 1 wherein said water barrier comprises a low viscosity liquid sprayed over and in proximity to said socket.

4. The assembly of claim 1 wherein said water barrier comprises a liquid in which said motherboard can be dipped.

5. The assembly of claim 1 wherein said microprocessor comprises a CPU in the form of a die appended to a support, said support being in electrical contact with said socket.

6. The assembly of claim 5 wherein said water barrier is further applied to said support surrounding and abutting said die.

7. The assembly of claim 5 wherein said heat sink is in contact with said die.

8. The assembly of claim 1 wherein said moisture absorbent comprises cotton cloth.

9. The assembly of claim 4 wherein said water barrier comprises a liquid in which said motherboard is dipped and which thereupon dries to a solid.

10. The assembly of claim 1 wherein said water barrier comprises a latex paint.

11. The assembly of claim 1 wherein said water barrier comprises an oil base paint.

12. The assembly of claim 1 wherein said water barrier comprises finger nail polish.

13. An assembly for use in a computing device comprising a microprocessor and a mother board that includes a socket for receiving and making electric contact with said microprocessor, said assembly further comprising a casing surrounding at least a portion of said microprocessor, said casing having an inlet and outlet for circulating a coolant proximate said microprocessor and wherein a water barrier is applied to and proximate said socket for preventing water condensation from contacting areas coveted by said barrier wherein a moisture absorbent is applied to said casing to substantially prevent water of condensation from contacting areas proximate said socket and wherein an outer shell is applied to said moisture absorbent and casing to maintain said moisture absorbent proximate said casing.

14. The assembly of claim 13 wherein said moisture absorbent comprises cotton cloth.

\* \* \* \* \*